(12) United States Patent
Yoon et al.

(10) Patent No.: US 9,887,305 B2
(45) Date of Patent: Feb. 6, 2018

(54) AGGLOMERATED PRECURSOR FOR MANUFACTURING LIGHT ABSORPTION LAYER OF SOLAR CELLS AND METHOD OF MANUFACTURING THE SAME

(71) Applicant: LG CHEM, LTD., Seoul (KR)

(72) Inventors: Seokhee Yoon, Daejeon (KR); Seokhyun Yoon, Daejeon (KR); Taehun Yoon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 66 days.

(21) Appl. No.: 14/899,540

(22) PCT Filed: Aug. 1, 2014

(86) PCT No.: PCT/KR2014/007092
§ 371 (c)(1),
(2) Date: Dec. 17, 2015

(87) PCT Pub. No.: WO2015/016651
PCT Pub. Date: Feb. 5, 2015

(65) Prior Publication Data
US 2016/0149059 A1 May 26, 2016

(30) Foreign Application Priority Data

Aug. 1, 2013 (KR) .................. 10-2013-0091791

(51) Int. Cl.
*H01L 31/032* (2006.01)
*C09D 11/52* (2014.01)
(Continued)

(52) U.S. Cl.
CPC ............ *H01L 31/0322* (2013.01); *C09D 5/32* (2013.01); *C09D 11/52* (2013.01);
(Continued)

(58) Field of Classification Search
None
See application file for complete search history.

(56) References Cited

U.S. PATENT DOCUMENTS 6,268,014 B1 * 7/2001 Eberspacher ..... H01L 21/02568
257/E31.027
7,563,430 B2 * 7/2009 Caldwell .............. B01J 13/0026
423/508

(Continued)

FOREIGN PATENT DOCUMENTS

JP  2009-507369 A  2/2009
JP  2013-021043 A  1/2013

(Continued)

OTHER PUBLICATIONS

International Search Report for PCT/KR2014/007092 filed Aug. 1, 2014.

*Primary Examiner* — Katie L Hammer

(57) ABSTRACT

Disclosed are an aggregated precursor for manufacturing a light absorption layer of solar cells comprising a first phase comprising a copper (Cu)-containing chalcogenide and a second phase comprising an indium (In) and/or gallium (Ga)-containing chalcogenide wherein 30% or more aggregated precursors based on the total amount of precursors are divided into particle aggregates comprising first phases and/or second phases, or independent particles having first phases or second phases, in an ink solvent for manufacturing the light absorption layer, and a method of manufacturing the same.

11 Claims, 22 Drawing Sheets

(51) Int. Cl.
*C09D 5/32* (2006.01)
*H01L 31/0392* (2006.01)
*H01L 21/02* (2006.01)

(52) U.S. Cl.
CPC .. *H01L 21/02568* (2013.01); *H01L 21/02601* (2013.01); *H01L 21/02628* (2013.01); *H01L 31/03923* (2013.01); *Y02E 10/541* (2013.01)

(56) References Cited

U.S. PATENT DOCUMENTS

| | | | |
|---|---|---|---|
| 8,329,501 B1 | 12/2012 | Robinson et al. | |
| 2007/0163640 A1* | 7/2007 | Van Duren | B22F 1/0055 136/262 |
| 2008/0175982 A1* | 7/2008 | Robinson | H01L 31/0322 427/74 |
| 2008/0300323 A1* | 12/2008 | Caldwell | B01J 13/0026 516/33 |
| 2009/0305449 A1 | 12/2009 | Bollman et al. | |
| 2010/0227066 A1 | 9/2010 | Chung | |
| 2012/0037041 A1* | 2/2012 | Nolte | B22F 1/0062 106/287.18 |
| 2012/0100660 A1 | 4/2012 | Hagedorn et al. | |
| 2012/0171847 A1* | 7/2012 | Robinson | H01L 21/02568 438/478 |
| 2013/0118585 A1* | 5/2013 | Anderson | C09D 11/52 136/264 |

FOREIGN PATENT DOCUMENTS

| | | |
|---|---|---|
| KR | 10-2007-0027433 A | 3/2007 |
| KR | 10-2012-0075827 A | 7/2012 |
| KR | 10-2012-0089159 A | 8/2012 |
| KR | 10-1194375 B1 | 10/2012 |
| WO | WO 2012/090339 A1 | 7/2012 |
| WO | WO 2012/112821 A1 | 8/2012 |

* cited by examiner

[FIG. 1]
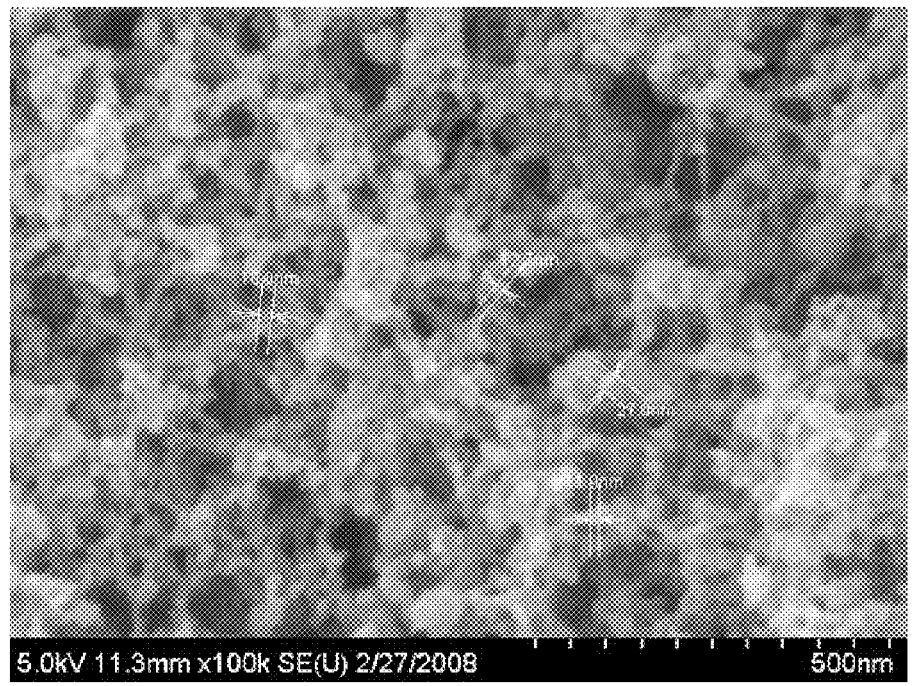

[FIG. 2]
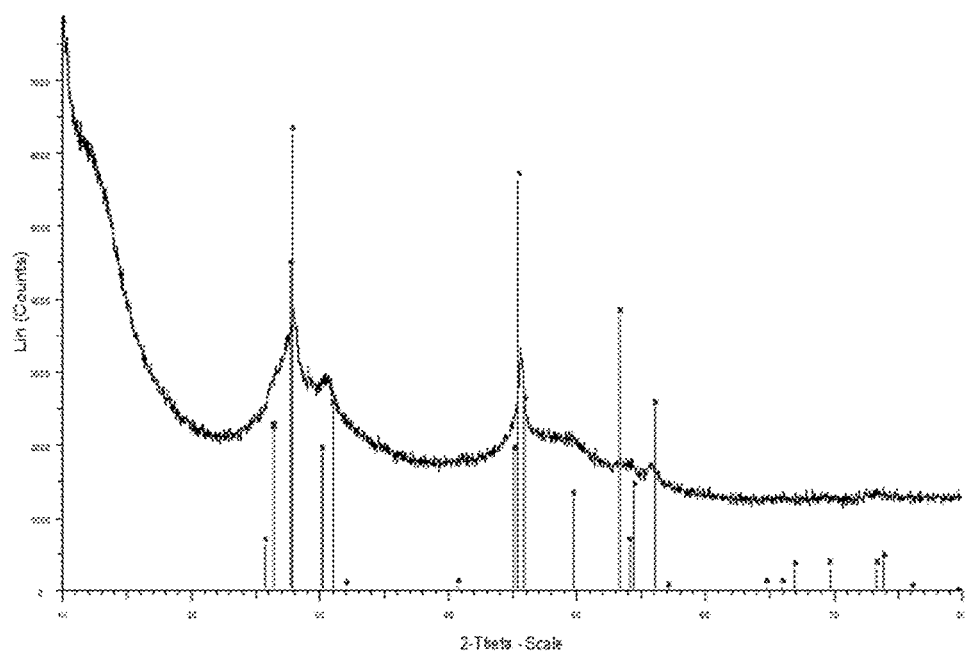

[FIG. 3]

[FIG. 4]
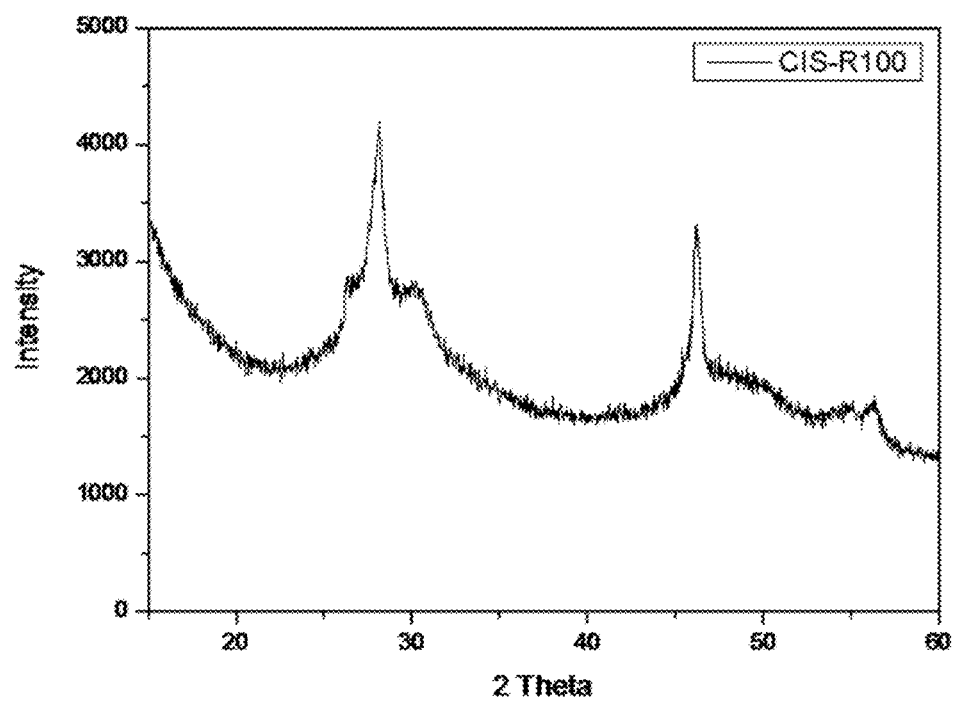

[FIG. 5]
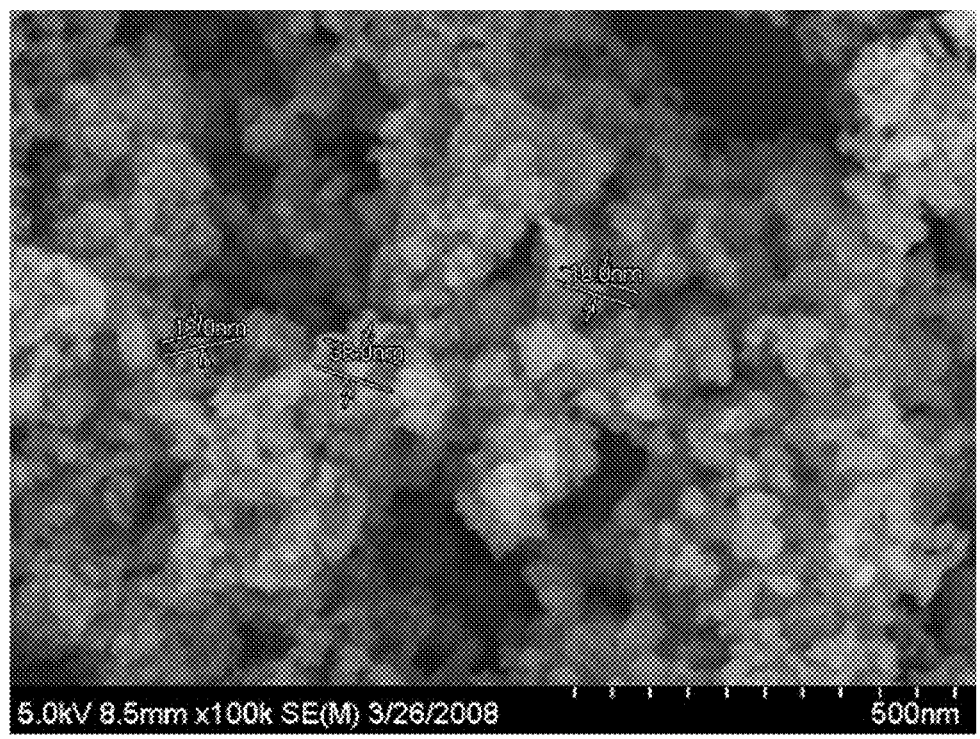

[FIG. 6]
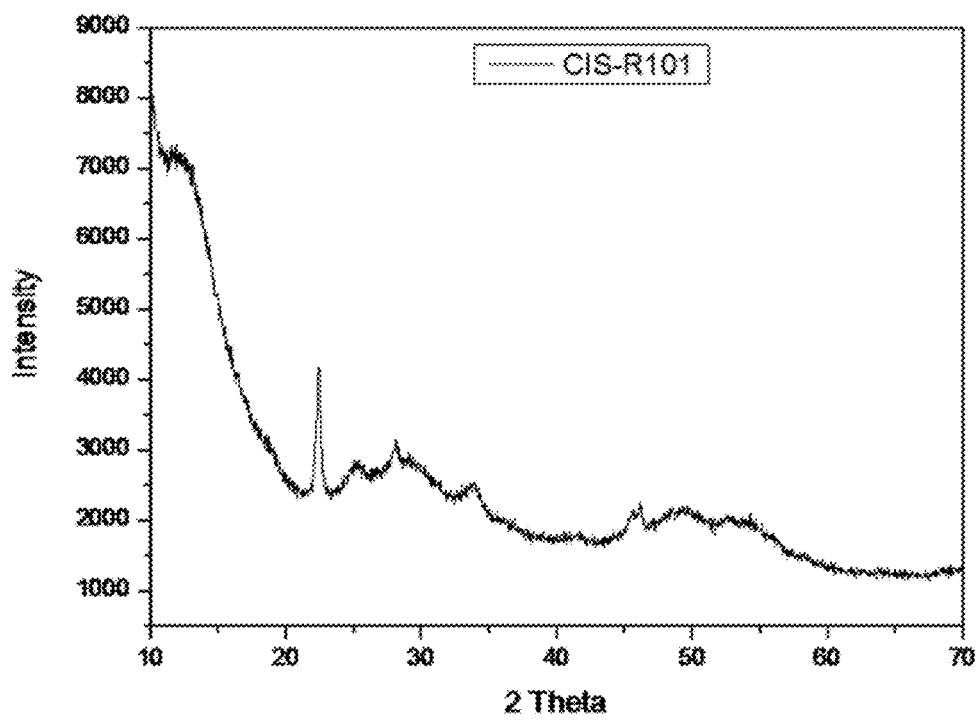

[FIG.7]
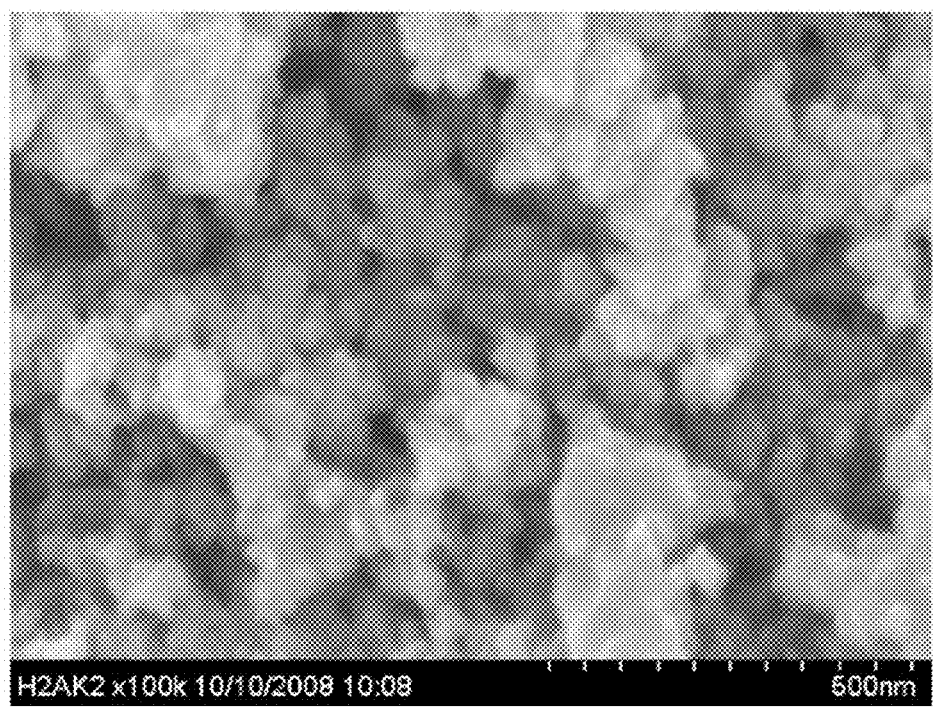

[FIG.8]
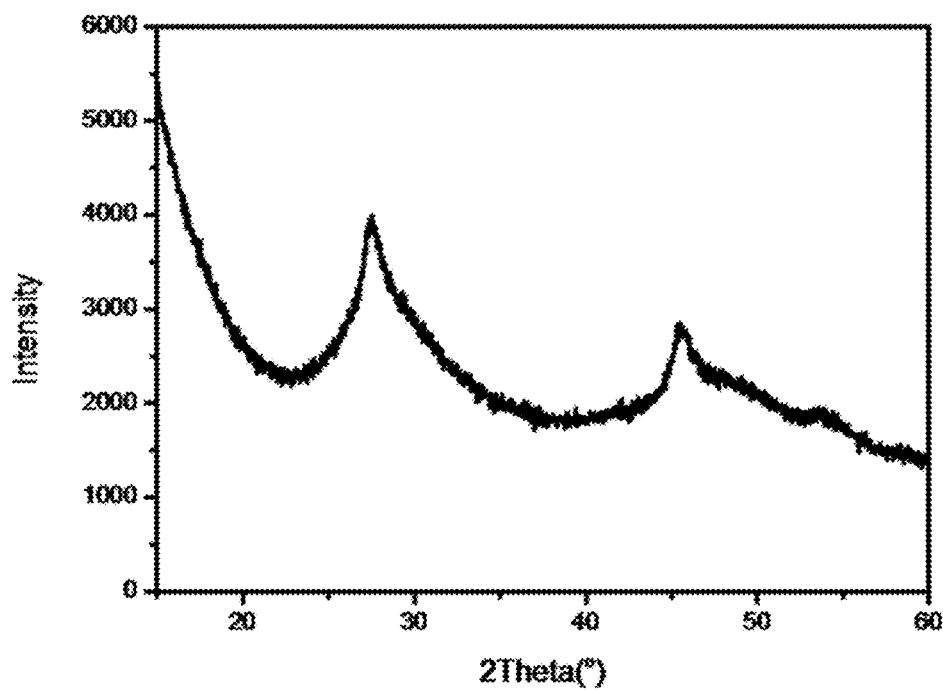

[FIG.9]
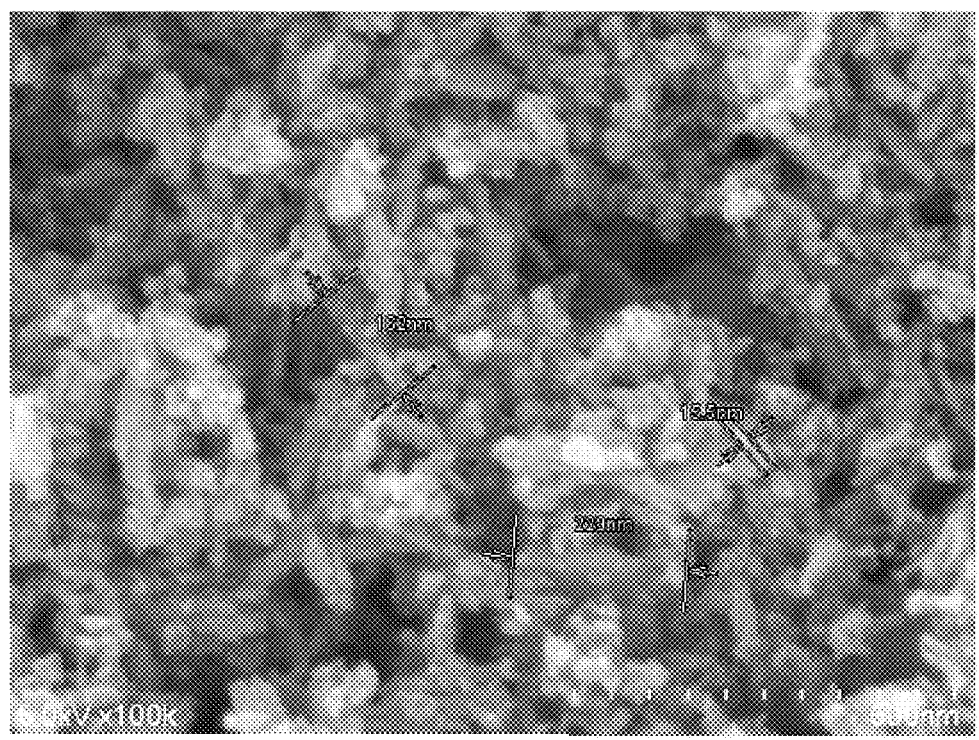

[FIG.10]
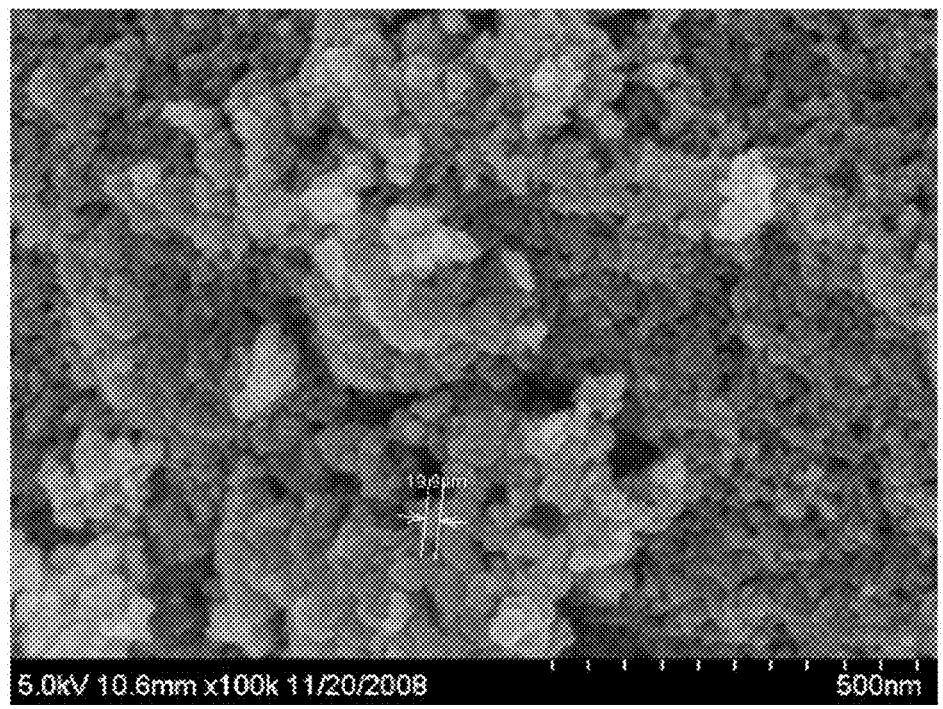

[FIG.11]
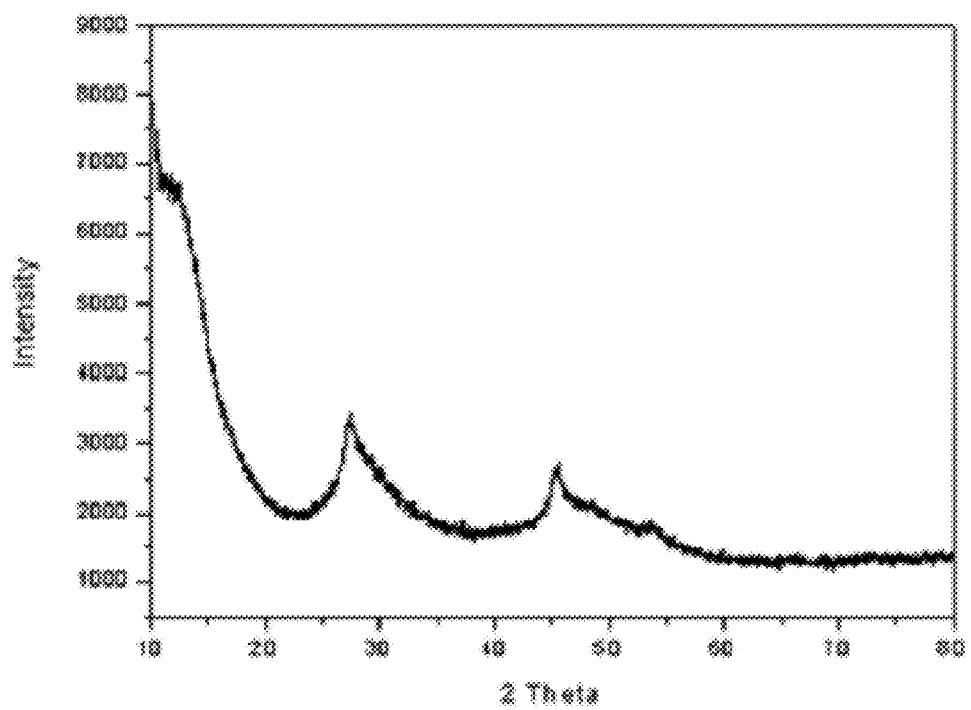

[FIG.12]
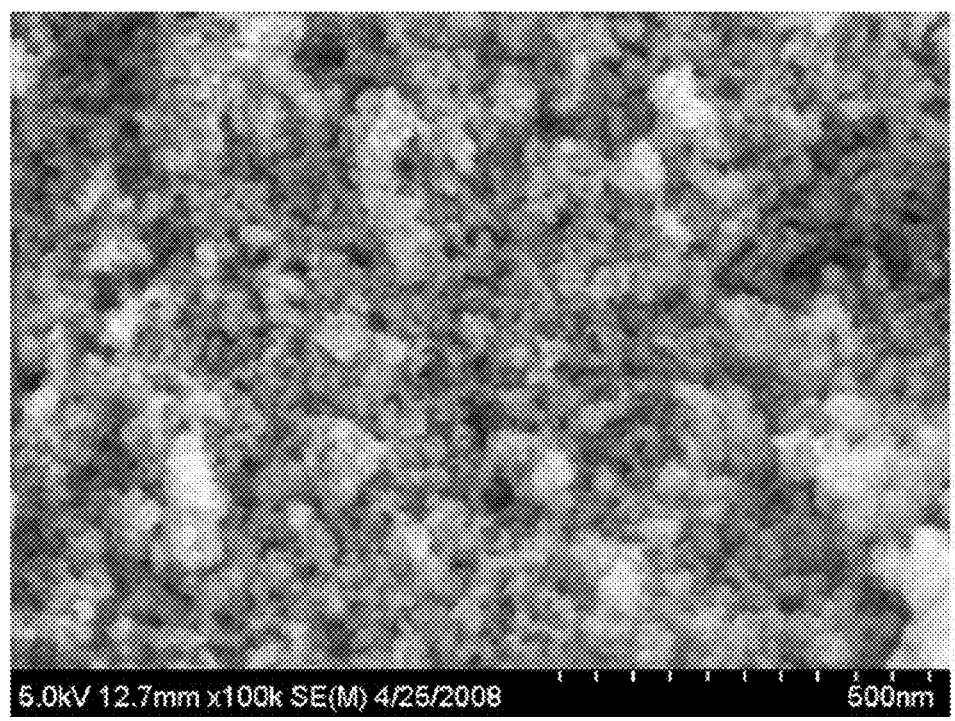

[FIG.13]
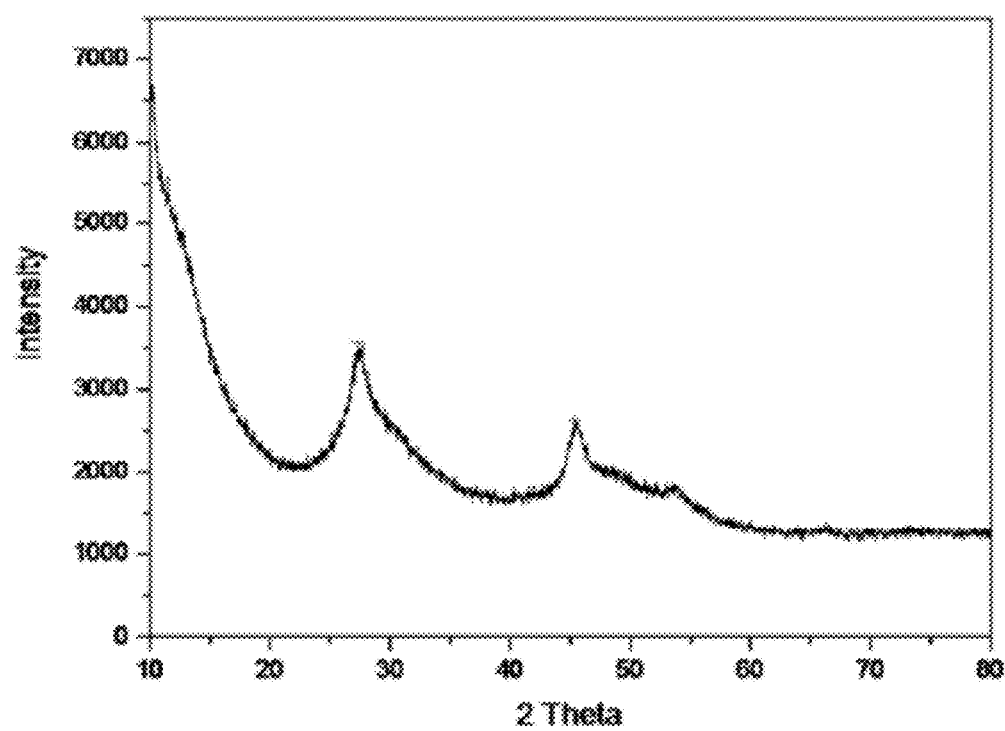

[FIG.14]
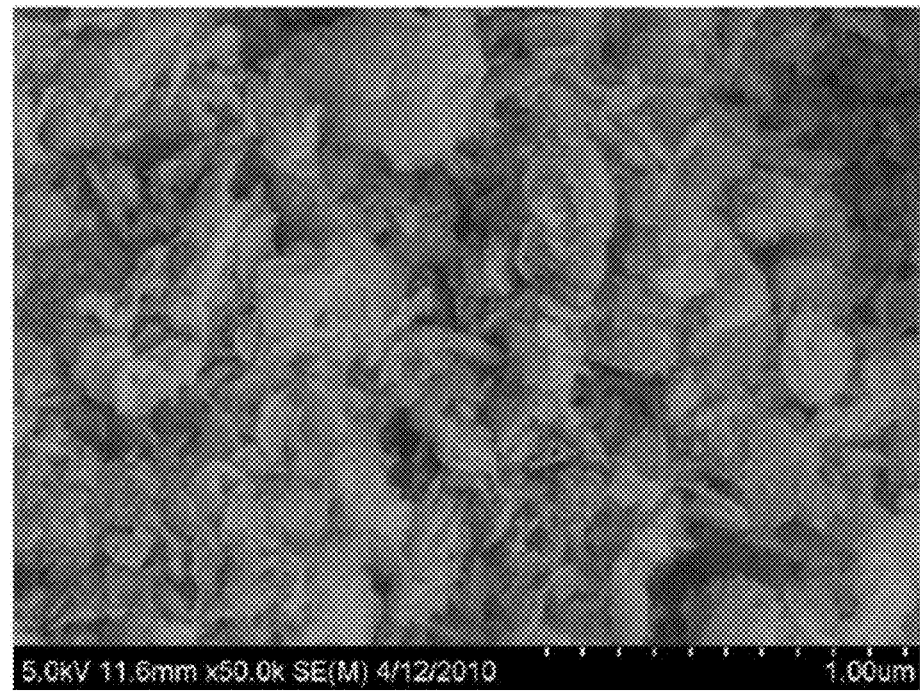

[FIG.15]
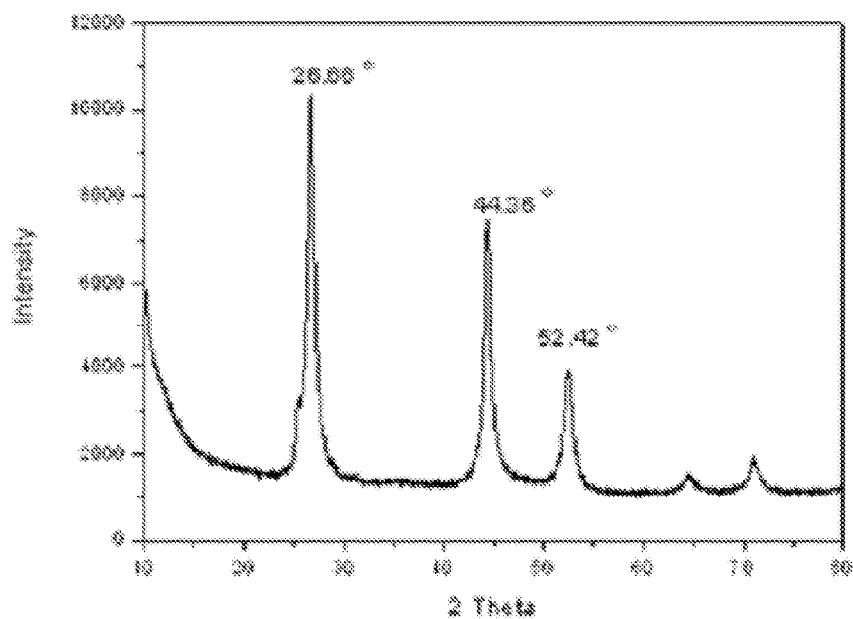
[FIG.16a] [FIG.16b]
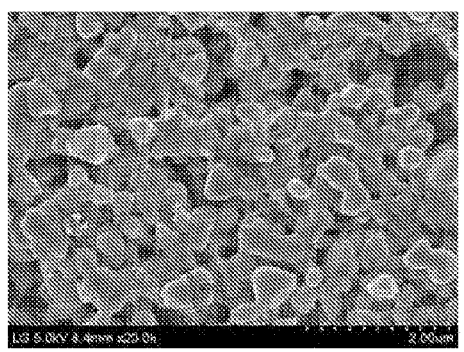 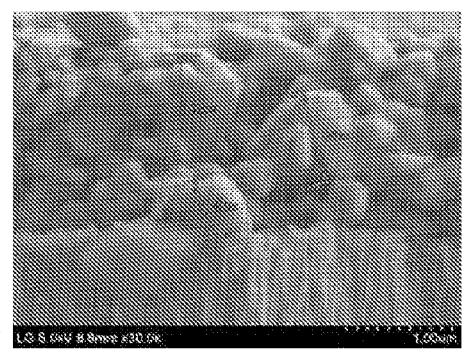

[FIG.17]
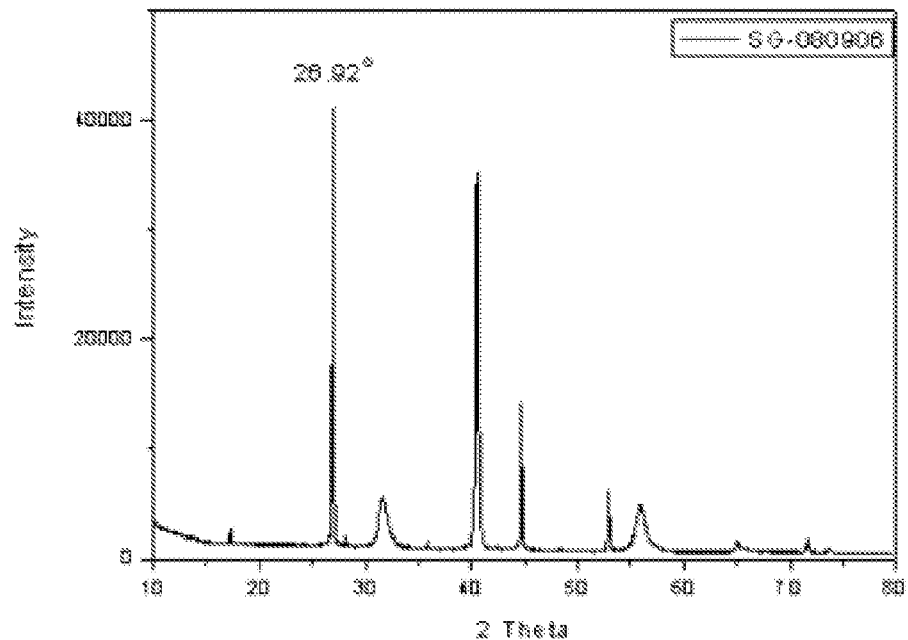
[FIG.18a]
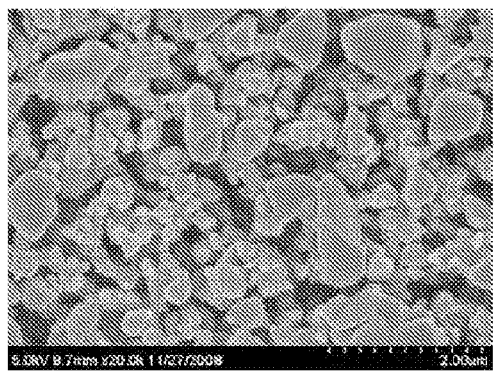
[FIG.18b]
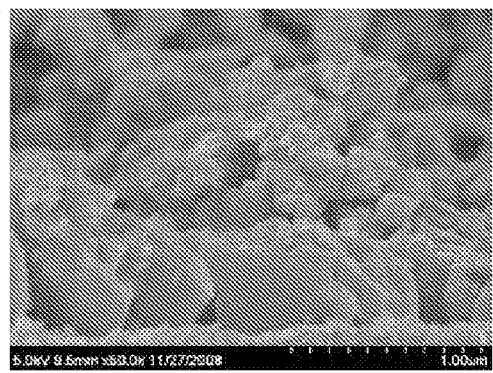

[FIG.19]
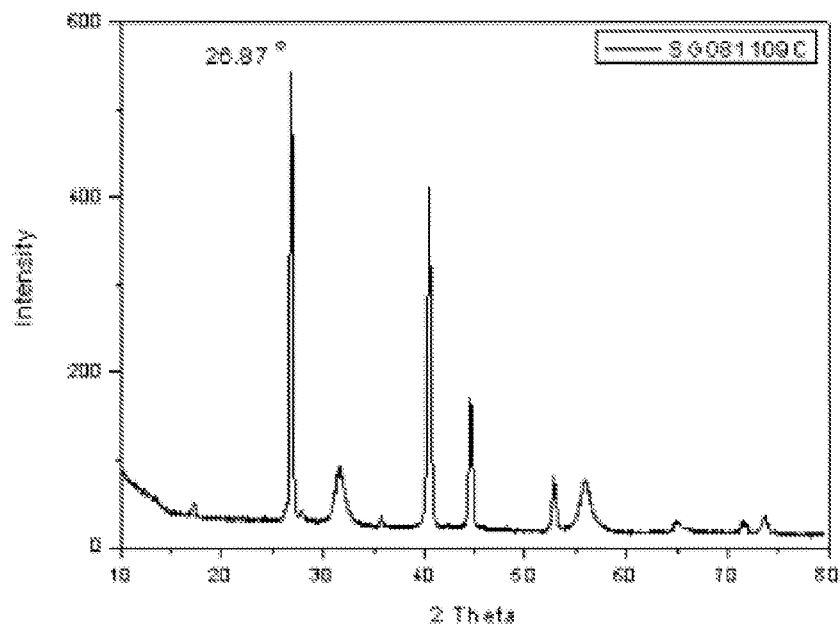
[FIG.20a] [FIG.20b]
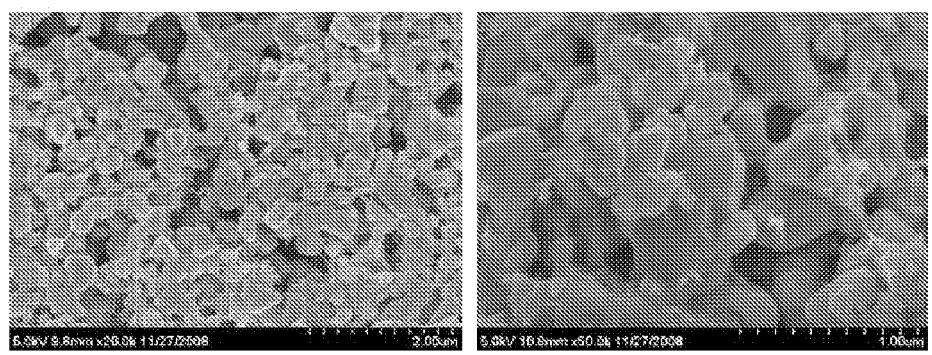

[FIG.21]
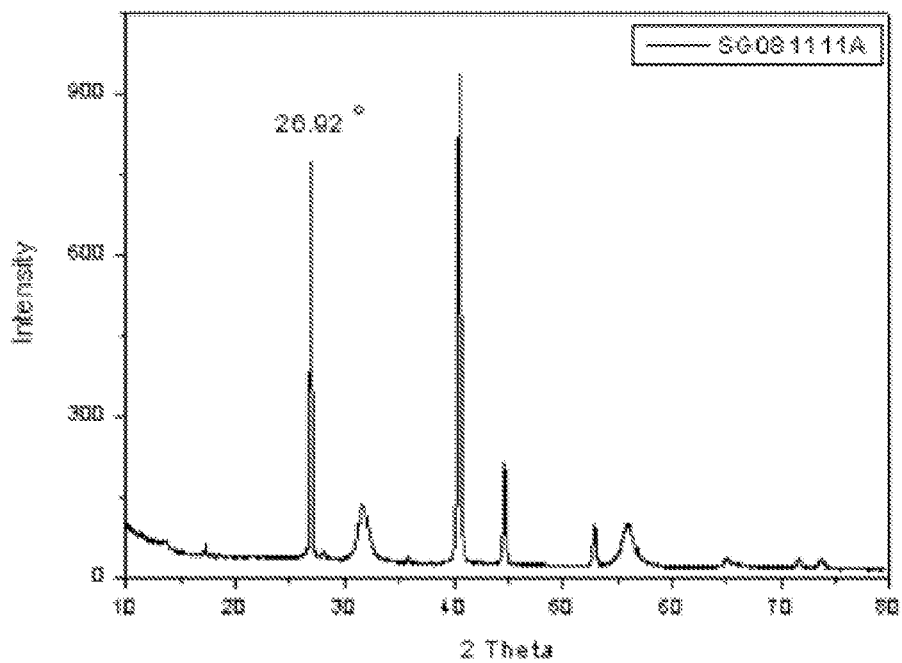
[FIG.22a]
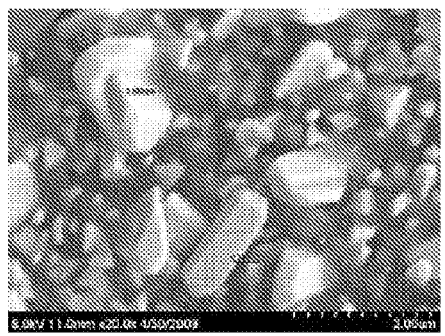
[FIG.22b]

[FIG.23]
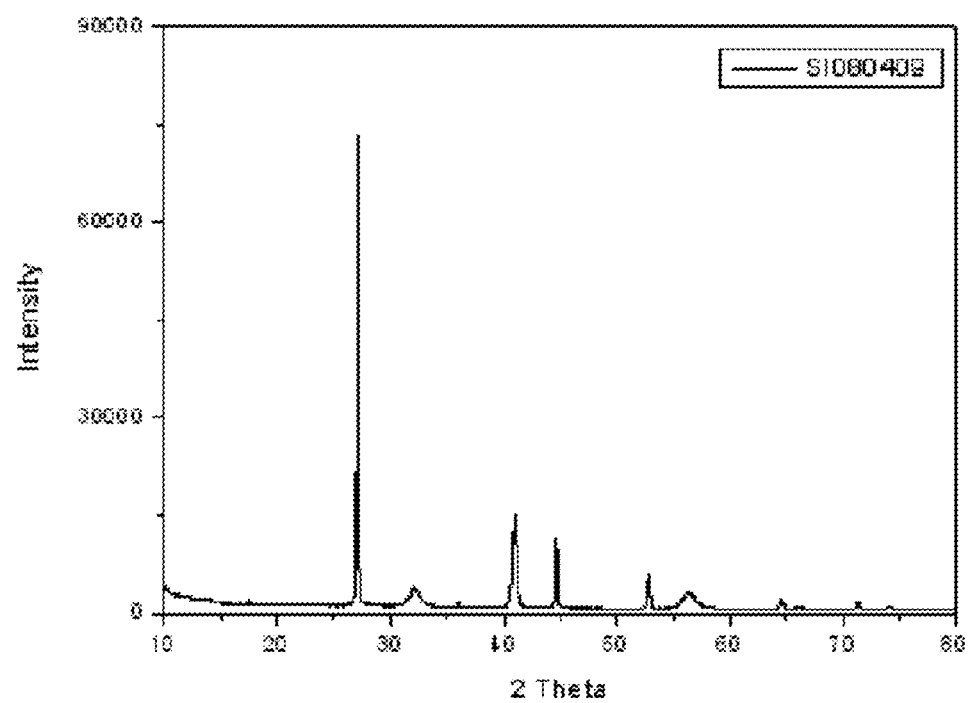

[FIG.24]
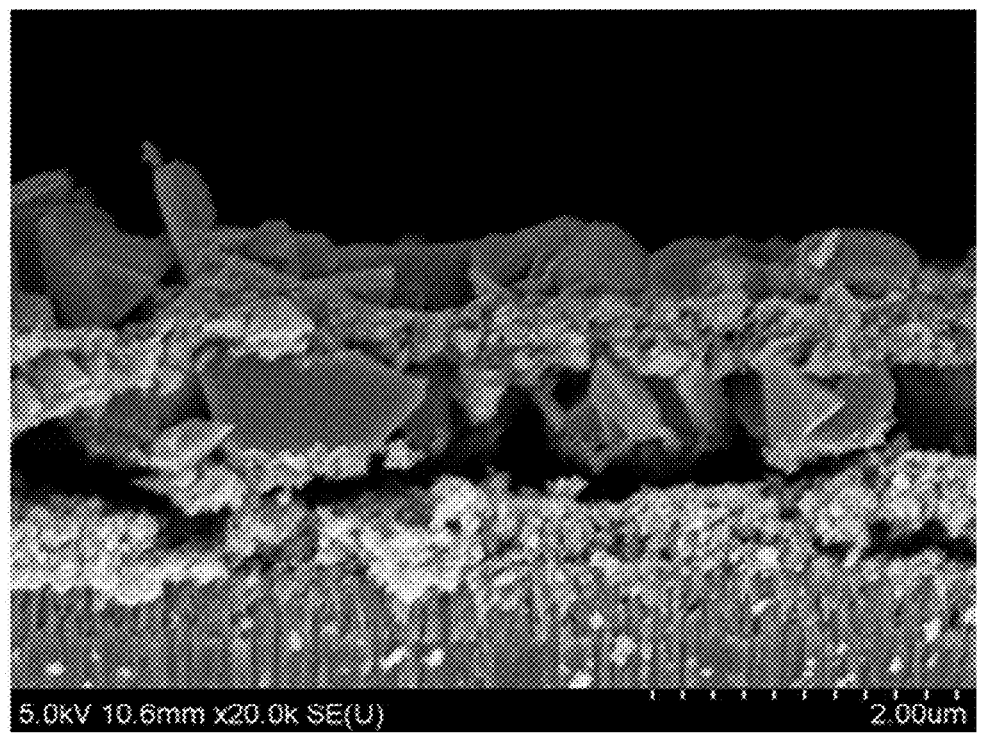

[FIG.25]
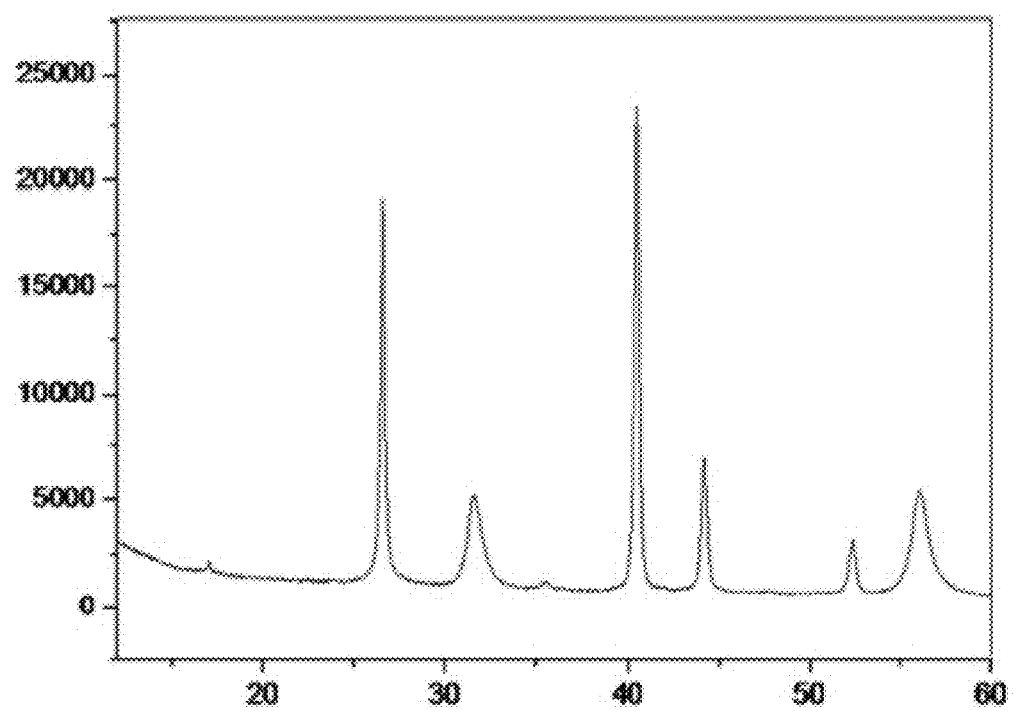

[FIG.26]
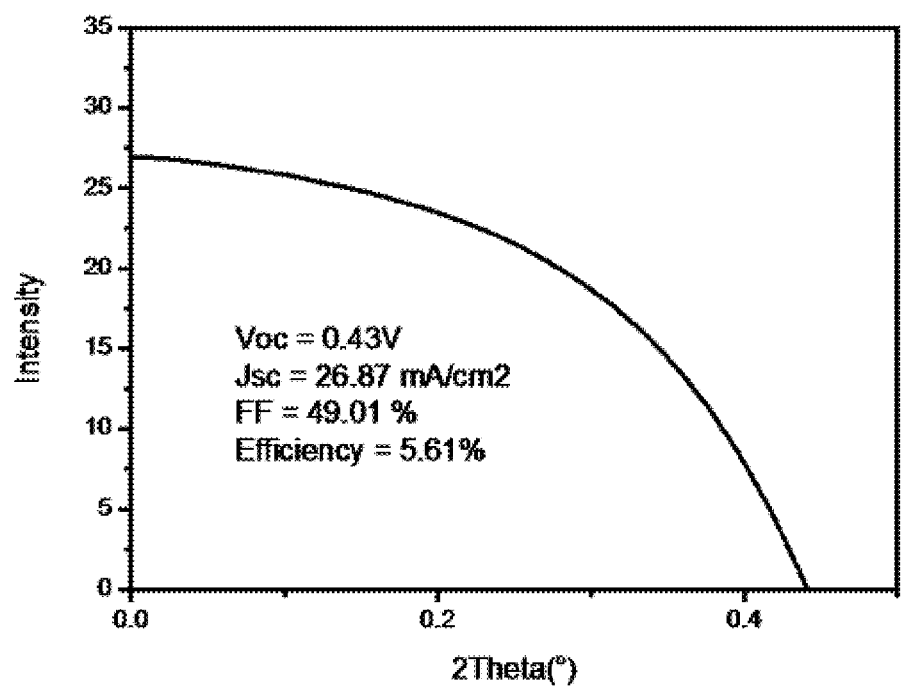

AGGLOMERATED PRECURSOR FOR MANUFACTURING LIGHT ABSORPTION LAYER OF SOLAR CELLS AND METHOD OF MANUFACTURING THE SAME

CROSS REFERENCE TO RELATED APPLICATIONS

The present invention is a U.S. National Stage of PCT/KR2014/007092, filed Aug. 1, 2014, which claims the priority of Korean patent application No. 10-2013-0091791, filed Aug. 1, 2013, which are incorporated herein by reference.

TECHNICAL FIELD

The present invention relates to an aggregated precursor for manufacturing a light absorption layer of solar cells and a method of manufacturing the same.

BACKGROUND ART

Recently, people are more concerned about environmental problems and depletion of natural resources and, as such, interest in solar cells as an alternative energy source which does not cause environmental pollution is growing. Solar cells are classified into silicon solar cells, thin film-type compound solar cells, layered-type solar cells and the like. Among these solar cells, silicon semiconductor solar cells have been studied the most widely.

Among these solar cells, recently, thin film type compound solar cells are actively studied and developed.

Among thin film type compound semiconductors, $Cu(In_{1-x}Ga_x)(Se_yS_{1-y})$ (CI(G)S), which is a Group I-III-VI compound included in ternary compounds, has a direct transition type energy band gap of 1 eV or more and high light absorption coefficient. In addition, the $Cu(In_{1-x}Ga_x)(Se_yS_{1-y})$ (CI(G)S) is an electro-optically stable. Thus, the $Cu(In_{1-x}Ga_x)(Se_yS_{1-y})$ (CI(G)S) is an ideal material as a light absorption layer of solar cells.

CI(G)S based solar cells are made by forming a light absorption layer having a thickness of several microns. As methods of manufacturing the light absorption layer, a vacuum deposition method which does not require a precursor, a sputtering method which forms a CI(G)S thin film through heat treatment after forming a thin film with a precursor and an electrodeposition method were introduced. Recently, an ink coating method was introduced. According to the ink coating method, under non-vacuum, a precursor material is coated and then the coated material is heat-treated. Among these light absorption layer manufacturing methods, studies into the ink coating method are actively conducted since, by using the ink coating method, process costs may be reduced and a large area may be uniformly manufactured. Precursors used in the ink coating method may be various compounds or metals such as metal chalcogenide compounds, bimetallic metal particles, metal salts, metal oxides or the like.

In particular, when a metal chalcogenide compound is used as a precursor, a mixed Cu—Se and In—Se compound or synthesized $CuInSe_2$ single-phase particles are used. When the mixed particles are used, a coating layer having a partially non-uniform composition may be formed. When the $CuInSe_2$ single-phase particles are used, long reaction time for particle growth is required.

Therefore, there is a high need to develop a technology for a precursor which may form a highly efficient light absorption layer having an entirely more uniform composition, being stable against oxidation and having increased film density.

DISCLOSURE

Technical Problem

Therefore, the present invention has been made to solve the above and other technical problems that have yet to be resolved.

As a result of a variety of intensive studies and various experiments, the inventors of the present invention developed an aggregated precursor including a first phase including a copper (Cu)-containing chalcogenide and a second phase including an indium (In) and/or gallium (Ga)-containing chalcogenide such that all constituting elements forming a light absorption layer are included, and confirmed that, when a thin film is manufactured using the aggregated precursor, the thin film has an entirely uniform composition and is stable against oxidation and the amount of a Group VI element included in the thin film is increased due to S or Se included in the precursor, thus completing the present invention.

Technical Solution

In accordance with one aspect of the present invention, provided is a precursor for manufacturing a light absorption layer including a first phase including a copper (Cu)-containing chalcogenide and a second phase including an indium (In) and/or gallium (Ga)-containing chalcogenide as an aggregated precursor wherein 30% or more aggregated precursors based on the total weight of the precursors are divided into particle aggregates including first phases and/or second phases, or independent particles having first phases or second phases in an ink solvent for manufacturing the light absorption layer in an ink solvent for manufacturing the light absorption layer.

The term "aggregated precursor", as used in the present invention means a precursor type in which independent particles are uniformly aggregated such that two or more phases are included. The term "particle aggregate" means a type of independent particle aggregated to a small amount in a smaller range than the aggregated precursor as a portion separated from the aggregated precursor. In addition, the term "independent particle" means a single particle.

Therefore, the aggregated precursor, particle aggregate and independent particles have different concepts in the present invention.

In a specific embodiment, the diameters of the independent particles on which all constitutions are based may be 1 nanometer to 100 nanometers, particularly 5 nanometers to 100 nanometers.

In addition, the diameter of the particle aggregate in which independent particles is aggregated in a small amount and which broadly means all type of two or more particles aggregated in a small amount may be 2 nanometers to 200 nanometers in the broadest range. The diameter of the aggregated precursor from which the particle aggregate originates may be 10 nanometers to 500 nanometers, particularly 15 nanometers to 300 nanometers in a broader range than the particle aggregate.

Meanwhile, the "chalcogenide" of the present invention means a Group VI element, for example, a material including sulfur (S) and/or selenium (Se). In a specific embodiment, the copper (Cu)-containing chalcogenide may be at least one selected from the group consisting of $Cu_yS$ ($0.5 \leq y \leq 2.0$) and $Cu_ySe$ ($0.5 \leq y \leq 2.0$), and the indium (In) and/or gallium (Ga) chalcogenide may be at least one selected from the group consisting of $(In_x(Ga)_{1-x})_mSe_n$ ($0 \leq x \leq 1$ and $0.5 \leq n/m \leq 2.5$) and $(In_x(Ga)_{1-x})_mS_n$ ($0 \leq x \leq 1$ and $0.5 \leq n/m \leq 2.5$).

As described above, when the aggregated precursor includes two or more phase types, the composition ratio of the chalcogenide element may be 0.5 mol to 3 mol based on 1 mol of a mixture of copper (Cu), indium (In) and gallium (Ga), with respect to the total amount of the aggregated precursor.

Outside this range, when the composition ratio of the chalcogenide element is less than 0.5 mol, the Group VI element is not sufficiently provided and, as such, a film in which the Group VI element is partially deficient may be formed. On the contrary, when the composition ratio of the chalcogenide element exceeds 3 mol, the Group VI element is non-uniformly distributed in a thin film and, as such, a film may non-uniformly grow.

In addition, a composition ratio of copper (Cu) may be 0.7 to 1.2 based on 1 mol of a mixture of In and Ga with respect to the total amount of the aggregated precursor.

Outside this range, when the composition ratio of copper (Cu) exceeds 1.2 mol, the first phase including the copper (Cu)-containing chalcogenide exists in a relatively large amount and, as such, particles may easily grow but Cu impurities may be generated. On the contrary, when the composition ratio of copper (Cu) is less than 0.7 mol, the first phase including the copper (Cu)-containing chalcogenide is deficient and thereby the diameters of the particles are small and formation of a p-type CI(G)S thin film is not easy, and, accordingly, performances are poor.

As described above, in the ink solvent for manufacturing the light absorption layer, a certain amount or more of the aggregated precursor according the present invention is divided into the particle aggregate including the first phase and/or second phase, or independent particles having a first phase or a second phase.

As described above, when some particle aggregates separated from the aggregated precursor exist in a uniformly distributed state, the separated particle aggregates may be more uniformly distributed than the aggregated precursor. Therefore, when an ink is coated to manufacture a thin film, coating properties may be improved. In addition, when compared with an ink manufactured using nanoparticles including a first phase or nanoparticles including a second phase separately dispersed in a solvent, an ink manufactured using the aggregated precursor has a more uniform composition. Further, when compared with an ink manufactured using single-phase particles including all elements forming a light absorption layer, by using an ink manufactured using the aggregated precursors, a CI(G)S thin film may be smoothly grown.

The above ink solvent for manufacturing the light absorption layer will be separately described later.

Methods of manufacturing the aggregated precursor for manufacturing the light absorption layer may be broadly divided into two methods.

As a first example, a method of manufacturing the aggregated precursor including sulfur (S) and/or selenium (Se) includes:

(i) preparing a first solution including a reducing agent;

(ii) preparing a second solution including a sulfur (S) and/or selenium (Se) compound, a third solution including indium (In) salt and/or gallium (Ga) salt and a fourth solution including a copper (Cu) salt;

(iii) mixing the first solution and second solution to manufacture a mixture;

(iv) mixing and reacting the third solution with the mixture of the mixing to synthesize indium (In) and/or gallium (Ga)-containing chalcogenide particles; and (v) mixing the fourth solution with the solution including the indium (In) and/or gallium (Ga)-containing chalcogenide particles of the mixing and reacting to synthesize a first phase including a copper (Cu)-containing chalcogenide and a second phase including an indium (In) and/or gallium (Ga)-containing chalcogenide to synthesize the aggregated precursor for manufacturing a light absorption layer.

In addition, as a method of manufacturing an aggregated precursor including sulfur(S) and/or selenium (Se), to obtain a more sufficient Group VI element, a mixture is manufactured by mixing a fifth solution including a reducing agent and a sixth solution including a sulfur(S) and/or selenium (Se) compound, regardless of step (i) to step (iii), before step (v), and the mixture is mixed with the solution including indium (In) and/or gallium (Ga)-containing chalcogenide particles and the fourth solution of step (v) to manufacture an aggregated precursor.

Regardless of manufacturing methods, the method of manufacturing the aggregated precursor according to the present invention is carried out through sequential processes in one reactor and, as such, the aggregated precursor has unique characteristics described above and may have a more uniform composition when compared with a precursor manufactured by separately synthesizing the nanoparticles including the first phase and the nanoparticles including the second phase, and then mixing the nanoparticles including the first phase or the nanoparticles including the second phase. As well as, when compared with use of $CuInS(Se)_2$ single-phase particles, time required for growth and reaction of particles times may be shortened.

Especially, when the mixture was mixed with the third solution in step (iv) and the solution including the indium (In) and/or gallium (Ga)-containing chalcogenide particles of step (iv) and the fourth solution are mixed, by stirring a solution while slowly adding the third solution and fourth solution dropwise, an aggregated precursor having a uniform composition and size may be obtained.

As a specific embodiment, in both cases, to improve dispersibility of an aggregated precursor and to obtain uniform composition distribution, when the fourth solution is mixed with the solution including the indium (In) and/or gallium (Ga)-containing chalcogenide particles of step (v), or a mixture of the fifth solution and the sixth solution, the solution including the indium (In) and/or gallium (Ga)-containing chalcogenide particles, and the fourth solution are mixed, an additive may be further added.

The additive is not specifically limited so long as the additive may used as a dispersing agent and, for example, may be at least one selected from the group consisting of polyvinylpyrrolidone (PVP), polyvinyl alcohol, and ethyl cellulose.

In a specific embodiment, the reducing agent included in the first solution may be an organic reducing agent and/or an inorganic reducing agent and particularly one selected from the group consisting of $LiBH_4$, $NaBH_4$, $KBH_4$, $Ca(BH_4)_2$, $Mg(BH_4)_2$, $LiB(Et)_3H$, $NaBH_3(CN)$, $NaBH(OAc)_3$, hydrazine, ascorbic acid and triethanolamine.

Accordingly, the method of manufacturing the aggregated precursor is performed by a solution process instead of the prior vacuum process and, as such, process costs may be reduced.

In a specific embodiment, solvents for the first solution to sixth solution each independently may be at least one selected from the group consisting of water, alcohols, acetic acids, diethylene glycol (DEG), oleylamine, ethylene glycol, triethylene glycol, dimethyl sulfoxide, dimethyl formamide, and N-methyl-2-pyrrolidone (NMP). The alcohol solvents may be methanol, ethanol, propanol, butanol, pentanol, hexanol, heptanol and octanol having 1 to 8 carbons.

In a specific embodiment, as the Group VI source included in the second solution, the sulfur (S) compound may be at least one selected from the group consisting of, for example, sulfur (S) powder, $H_2S$, $Na_2S$, $K_2S$, CaS, $(CH_3)_2S$, $H_2SO_4$, and hydrates thereof, thiourea, and thioacetamide, and the selenium (Se) compound may be at least one selected from the group consisting of, for example, Se powder, $H_2Se$, $Na_2Se$, $K_2Se$, CaSe, $(CH_3)_2Se$, $SeO2$, $SeCl_4$, $H_2SeO_3$, $H_2SeO_4$ and hydrates thereof, selenourea, and selenous acid.

In a specific embodiment, the salts included in the third solution and fourth solution may be at least one selected from the group consisting of chlorides, bromides, iodides, nitrates, nitrites, sulfates, acetates, sulfites, acetylacetonate and hydroxides.

Meanwhile, as another example, a method of manufacturing the aggregated precursor including sulfur (S) and/or selenium (Se) includes:

(i) preparing a first solution including a sulfur (S) and/or selenium (Se) compound, a second solution including an indium (In) salt or indium (In) salt and gallium (Ga) salt, and a third solution including a copper (Cu) salt;

(ii) mixing and reacting the first solution and second solution to synthesize indium (In) and/or gallium (Ga)-containing chalcogenide particles; and (iii) mixing the third solution with the solution including the indium (In) and/or gallium (Ga)-containing chalcogenide particles of step (ii) to synthesize and purify an aggregated precursor for manufacturing a light absorption layer including the first phase including the copper (Cu)-containing chalcogenide and the second phase including the indium (In) and/or gallium (Ga)-containing chalcogenide.

Accordingly, the method of manufacturing the aggregated precursor is carried out by a solution process instead of a vacuum process and, as such, process costs may be reduced.

The second method of manufacturing the aggregated precursor is similar to the first method of manufacturing the aggregated precursor in that, to obtain a sufficient amount of the Group VI element, when the third solution is mixed with the solution including the indium (In) and/or gallium (Ga)-containing chalcogenide particles of step (iii), an aggregated precursor may be manufactured by mixing the fourth solution including the sulfur (S) and/or selenium (Se) compound besides the first solution of step (i).

Regardless of manufacturing methods, the method of manufacturing the aggregated precursor according to the present invention is carried out through sequential processes in one reactor and, as such, the aggregated precursor has unique characteristics described above and may have a more uniform composition when compared with a precursor manufactured by separately synthesizing the nanoparticles including the first phase and nanoparticles including the second phase, and then mixing the nanoparticles including the first phase or the nanoparticles including the second phase. In addition, when compared with use of $CuInS(Se)_2$ single-phase particles, time required for growth and reaction of particles times may be shortened In addition, when the first solution and second solution are mixed, and the third solution is mixed with the solution including the indium (In) and/or gallium (Ga)-containing chalcogenide particles of step (ii), by stirring a mixture while slowly adding the second solution and third solution dropwise, an aggregated precursor having a uniform composition and size may be obtained.

As a specific embodiment, in both cases, to improve dispersibility of an aggregated precursor and to obtain uniform composition distribution, when the third solution is mixed with the solution including the indium (In) and/or gallium (Ga)-containing chalcogenide particles of step (iii), or the solution including the indium (In) and/or gallium (Ga)-containing chalcogenide particles, the third solution and the fourth solution are mixed, and an additive may be further added.

Here, concrete examples of the additive are the same as those described above.

In addition, the other solvent and salt types of the sulfur (S) compound, selenium (Se) compound and the first solution to fourth solution are the same as those described above.

The present invention also provides a method of manufacturing a thin film using the ink composition.

A method of manufacturing the thin film according to the present invention includes:

(i) dispersing an aggregated precursor for manufacturing a light absorption layer including a first phase including a copper (Cu)-containing chalcogenide and a second phase including an indium (In) and/or gallium (Ga)-containing chalcogenide in a solvent to manufacture an ink;

(ii) coating the ink on a base provided with an electrode; and (iii) drying and then heat-treating the ink coated on the base provided with an electrode.

As a specific embodiment, the solvent of step (i) is not particularly limited so long as the solvent is a general organic solvent and may be one organic solvent selected from among alkanes, alkenes, alkynes, aromatics, ketones, nitriles, ethers, esters, organic halides, alcohols, amines, thiols, carboxylic acids, phosphines, phosphites, phosphates, sulfoxides, and amides or a mixture of at least one organic solvent selected therefrom.

In particular, the alcohols may be at least one mixed solvent selected from among ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amines may be at least one mixed solvent selected from among triethyl amine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, and tris(2-aminoethyl)amine.

The thiols may be at least one mixed solvent selected from among 1,2-ethanedithiol, pentanethiol, hexanethiol, and mercaptoethanol.

The alkanes may be at least one mixed solvent selected from among hexane, heptane, and octane.

The aromatics may be at least one mixed solvent selected from among toluene, xylene, nitrobenzene, and pyridine.

The organic halides may be at least one mixed solvent selected from among chloroform, methylene chloride, tetrachloromethane, dichloroethane, and chlorobenzene.

The nitriles may be acetonitrile.

The ketones may be at least one mixed solvent selected from among acetone, cyclohexanone, cyclopentanone, and acetyl acetone.

The ethers may be at least one mixed solvent selected from among ethyl ether, tetrahydrofuran, and 1,4-dioxane.

The sulfoxides may be at least one mixed solvent selected from among dimethyl sulfoxide (DMSO) and sulfolane.

The amides may be at least one mixed solvent selected from among dimethyl formamide (DMF) and n-methyl-2-pyrrolidone (NMP).

The esters may be at least one mixed solvent selected from among ethyl lactate, γ-butyrolactone, and ethyl acetoacetate.

The carboxylic acids may be at least one mixed solvent selected from among propionic acid, hexanoic acid, meso-2,3-dimercaptosuccinic acid, thiolactic acid, and thioglycolic acid.

However, the solvents are only given as an example, and embodiments of the present invention are not limited thereto.

In some cases, the ink of step (i) may further include an additive.

The additive may, for example, be at least one selected from the group consisting of a dispersant, a surfactant, a polymer, a binder, a crosslinking agent, an emulsifying agent, an anti-foaming agent, a drying agent, a filler, a bulking agent, a thickening agent, a film conditioning agent, an antioxidant, a fluidizer, a leveling agent, and a corrosion inhibitor. In particular, the additive may be at least one selected from the group consisting of polyvinylpyrrolidone (PVP), polyvinyl alcohol, Anti-terra 204, Anti-terra 205, ethyl cellulose, and DispersBYK110.

The coating of step (ii) may be any one selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet-printing, jet deposition, and spray deposition.

The heat treatment of step (iii) may be carried out at a temperature of 400 to 900° C.

Meanwhile, a selenization process may be included to prepare the thin film of a solar cell having much higher density. The selenization process may be carried out through a variety of methods.

As a first example, effects obtained from the selenization process may be achieved by manufacturing an ink by dispersing S and/or Se in a particle type in a solvent with the aggregated precursor for manufacturing the light absorption layer in step (i), and by combining the heat treatment of step (iii)

As a second example, effects obtained from the selenization process may be achieved through the heat treatment of step (iii) in the presence of S or Se In particular, S or Se may be present by supplying $H_2S$ or $H_2Se$ in a gaseous state or supplying Se or S in a gaseous state through heating.

As a third example, after step (ii), S or Se may be stacked on the coated base, followed by performing step (iii). In particular, the stacking process may be performed by a solution process or a deposition method.

The present invention also provides a thin film manufactured according to the above method.

The thickness of the thin film may be 0.5 to 5.0 μm, more particularly 0.5 to 3.0 μm.

When the thickness of the thin film is less than 0.5 μm, the density and amount of the light absorption layer are insufficient and thus desired photoelectric efficiency may not be obtained. On the other hand, when the thickness of the thin film exceeds 5.0 μm, movement distances of carriers increases and, accordingly, there is an increasing probability of recombination, which results in reduced efficiency.

Furthermore, the present invention provides a thin film solar cell manufactured using the thin film.

A method of manufacturing a thin film solar cell is known in the art and thus a detailed description thereof will be omitted herein.

BRIEF DESCRIPTION OF THE DRAWINGS

The above and other objects, features and other advantages of the present invention will be more clearly understood from the following detailed description taken in conjunction with the accompanying drawing, in which:

FIG. 1 is a scanning electron microscope (SEM) image of $In_2Se_3$—CuSe powder formed according to Example 1;

FIG. 2 is an X-ray diffraction (XRD) graph of $In_2Se_3$—CuSe powder formed according to Example 1;

FIG. 3 is a scanning electron microscope (SEM) image of $In_2Se_3$—CuSe powder formed according to Example 2;

FIG. 4 is an X-ray diffraction (XRD) graph of $In_2Se_3$—CuSe powder formed according to Example 2;

FIG. 5 is a scanning electron microscope (SEM) image of $In_2Se_3$—CuSe powder formed according to Example 3;

FIG. 6 is an X-ray diffraction (XRD) graph of $In_2Se_3$—CuSe powder formed according to Example 3;

FIG. 7 is a scanning electron microscope (SEM) image of $In_{0.7}Ga_{0.3}Se_{1.5}$—CuSe powder formed according to Example 4;

FIG. 8 is an X-ray diffraction (XRD) graph of $In_{0.7}Ga_{0.3}Se_{1.5}$—CuSe powder formed according to Example 4;

FIG. 9 is a scanning electron microscope (SEM) image of $In_2S_3$—Cu sulfur (S) powder formed according to Example 5;

FIG. 10 is a scanning electron microscope (SEM) image of $(In,Ga)_2Se_3$—CuSe powder formed according to Example 6;

FIG. 11 is an X-ray diffraction (XRD) graph of $(In,Ga)_2Se_3$—CuSe powder formed according to Example 6;

FIG. 12 is a scanning electron microscope (SEM) image of $In_2Se_3$—CuSe powder formed according to Example 7;

FIG. 13 is an X-ray diffraction (XRD) graph of $In_2Se_3$—CuSe powder formed according to Example 7;

FIG. 14 is a scanning electron microscope (SEM) image of $CuInSe_2$ powder formed according to Comparative Example 1;

FIG. 15 is an XRD graph of $CuInSe_2$ powder formed according to Comparative Example 1;

FIGS. 16a-16b are SEM images of a thin film manufactured according to Example 8;

FIG. 17 is an XRD graph of a thin film manufactured according to Example 8;

FIGS. 18a-18b are SEM images of a thin film manufactured according to Example 9;

FIG. 19 is an XRD graph of a thin film manufactured according to Example 9;

FIGS. 20a-20b are SEM images of a thin film manufactured according to Example 10;

FIG. 21 is an XRD graph of a thin film manufactured according to Example 10;

FIGS. 22a-22b are SEM images of a thin film manufactured according to Example 11;

FIG. 23 is an XRD graph of a thin film manufactured according to Example 11;

FIG. 24 is an SEM image of a thin film manufactured according to Comparative Example 2;

FIG. 25 is an XRD graph of a thin film manufactured according to Comparative Example 2; and FIG. 26 is a graph showing IV characteristics of a thin film solar cell manufactured according to Example 15.

BEST MODE

Now, the present invention will be described in more detail with reference to the following examples. These examples are provided only for illustration of the present invention and should not be construed as limiting the scope and spirit of the present invention.

Example 1

Synthesis of $In_2Se_3$—CuSe Particles

Under a nitrogen atmosphere, after mixing 1.974 g of $NaBH_4$ in 100 ml of distilled water, 1.974 g of Se powder was added thereto and then 100 ml of distilled water was further added. After confirming formation of a colorless and transparent solution, the solution was further stirred for 15 minutes. Subsequently, a solution produced by dissolving 2.212 g of $InCl_3$ in 50 ml distilled water was added thereto. The resulting mixture was further stirred for 10 minutes and then 50 ml of distilled water in which 1.705 g of $CuCl_2$ was dissolved was slowly added thereto. The resulting mixture was further stirred for 1 hour and then centrifuged. As a result, powder having a $CuInSe_{2.5}$ composition was obtained in a yield of 99%. The powder was analyzed using ICP. As a result, it was confirmed that the $CuInSe_{2.5}$ composition of the powder has a ratio of Cu:In:Se of 22.18:22.56:55.26 in mol %. As an XRD analysis result of the particles, CuSe crystalline phases were observed and it was confirmed that amorphous $In_2Se_3$ and superior CuSe crystalline phases were mixed. SEM-EDX and XRD analysis results of the particles are illustrated in FIGS. 1 and 2.

Example 2

Synthesis of $In_2Se_3$—CuSe Particles

Under a nitrogen atmosphere, after mixing 1.90 g of $NaBH_4$ in 150 ml of distilled water, 3.224 g of $H_2SeO_3$ dissolved in 60 ml of distilled water was added dropwise. After confirming formation of a colorless and transparent solution, a solution produced by dissolving 2.212 g of $InCl_3$ in 35 ml of distilled water was added thereto and then stirred for 5 minutes. Subsequently, 40 ml of distilled water in which 1.705 g of $CuCl_2$*$2H_2O$ was dissolved was added thereto. The resulting mixture was further stirred for one day and then centrifuged. As a result, powder having a $CuInSe_{2.5}$ composition was obtained in a yield of 99%. The powder was analyzed using ICP. As a result, it was confirmed that the $CuInSe_{2.5}$ composition of the powder has a ratio of Cu:In:Se of 2.42:22.20:56.38 in mol %. As an XRD analysis result of the particles, CuSe crystalline phases were observed and it was confirmed that amorphous $In_2Se_3$ and superior CuSe crystalline phases were mixed. SEM-EDX and XRD analysis results of the particles are illustrated in FIGS. 3 and 4.

Example 3

Synthesis of $In_2Se_3$—CuSe Particles

Under a nitrogen atmosphere, 1.135 g of $NaBH_4$ was added to 50 ml of distilled water and dissolved therein. Subsequently, a solution produced by dissolving 1.935 g of $H_2SeO_3$ in 30 ml of distilled water was added thereto. After confirming formation of a colorless and transparent solution, a solution produced by dissolving 2.212 g of $InCl_3$ in 50 ml of distilled water was added thereto and then was further stirred for 3.5 hours, resulting in $In_2Se_3$ particle formation. Under a nitrogen atmosphere, after dissolving 0.757 g of $NaBH_4$ in 50 ml of distilled water in another flask and then a solution produced by dissolving 1.290 g of $H_2SeO_3$ in 20 ml of distilled water was added thereto. The resulting mixture was stirred until a clear solution was observed. To this clear solution, the previously manufactured $In_2Se_3$ solution was added. Subsequently, a solution produced by dissolving 1.705 g of $CuCl_2$*$2H_2O$ in 50 ml of distilled water was added thereto and then was stirred for 1 day. The resulting solution was purified through centrifugation and then vacuum-dried, resulting in particles having a $CuInSe_{2.5}$ composition. The particles were analyzed using ICP. As a result, it was confirmed that the $CuInSe_{2.5}$ composition particles have a composition as follows: Cu:In:Se of 21.80:21.89:56.31 in mol %. In addition, as an XRD analysis result, the particles were observed as having a CuSe crystalline phase and as being in a mixed state of amorphous $In_2Se_3$ and CuSe having superior crystallinity. SEM-EDX and XRD results of the particles are illustrated in FIGS. 5 and 6.

Example 4

Synthesis of $In_{0.7}Ga_{0.3}Se_{1.5}$—CuSe Particles

Under a nitrogen atmosphere, 2.270 g of $NaBH_4$ was added to 100 ml of distilled water and dissolved therein. Subsequently, a solution produced by dissolving 3.869 g of $H_2SeO_3$ in 60 ml of distilled water was added thereto. After confirming formation of a colorless and transparent solution, a solution produced by dissolving 3.097 g of $InCl_3$ and 2.703 g of $GaI_3$ in 100 ml of distilled water was added thereto and then was further stirred for 1 day, resulting in $In_{0.7}Ga_{0.3}Se_{1.5}$ particle formation. Under a nitrogen atmosphere, after dissolving 1.665 g of $NaBH_4$ in 100 ml of distilled water in another flask and then a solution produced by dissolving 2.837 g of $H_2SeO_3$ in 40 ml of distilled water was added thereto. The resulting mixture was stirred until a clear solution was observed. To this clear solution, the previously manufactured $In_{0.7}Ga_{0.3}Se_{1.5}$ solution was added. Subsequently, a solution produced by dissolving 3.410 g of $CuCl_2$*$2H_2O$ in 100 ml of distilled water was added thereto and then was stirred for five hours. The resulting solution was purified through centrifugation and then vacuum-dried, resulting in particles having a $CuIn_{0.7}Ga_{0.3}Se_{2.5}$ composition. The particles were analyzed using ICP. As a result, it was confirmed that the $CuIn_{0.7}Ga_{0.3}Se_{2.5}$ composition particles have a composition as follows: Cu:In:Ga:Se:Na:B of 20.07:14.19:5.88:55.885:3.73:0.26 in mol %. In addition, as an XRD analysis result, the particles were observed as having a CuSe crystalline phase and as being in a mix state of amorphous (In,Ga)$_2$Se$_3$ and CuSe having superior crystallinity. SEM-EDX and XRD results of the particles are illustrated in FIGS. 7 and 8.

Example 5

Synthesis of In$_2$S$_3$—CuS Particles

Under a nitrogen atmosphere, 3.603 g of Na$_2$S*9H$_2$O was dissolved in 60 ml of distilled water and then a solution produced by dissolving 2.212 g of InCl$_3$ in 40 ml of distilled water was added thereto. The resulting solution was further stirred for one hour. To the solution, a solution produced by dissolving 2.402 g of Na$_2$S*9H$_2$O in 50 ml of distilled water was added and then stirred for ten minutes. Subsequently, a solution produced by dissolving 1.705 g of CuCl$_2$*2H$_2$O in 50 ml of distilled water was added thereto and then was further stirred for three hours. The resulting solution was purified through centrifugation and then vacuum-dried. As a result, particles including Cu and In in a ratio as follows: Cu:In of 2.64:3.10 were obtained. SEM-EDX results of the particles are illustrated in FIG. 9.

Example 6

Synthesis of (In,Ga)$_2$Se$_3$—CuSe Particles

Under a nitrogen atmosphere, 1.135 g of NaBH$_4$ was added to 50 ml of distilled water and dissolved therein. Subsequently, a solution produced by dissolving 1.935 g of H$_2$SeO$_3$ in 30 ml of distilled water was added thereto. After confirming formation of a colorless and transparent solution, a solution produced by dissolving 1.548 g of InCl$_3$ and 1.351 g of GaI$_3$ in 50 ml of distilled water was added thereto and then was further stirred for 1 day, resulting in In$_{0.7}$Ga$_{0.3}$Se$_{1.5}$ particle formation. Under a nitrogen atmosphere, after dissolving 0.666 g of NaBH$_4$ in 50 ml of distilled water in another flask and then a solution produced by dissolving 1.135 g of H$_2$SeO$_3$ in 20 ml of distilled water was added thereto. The resulting mixture was stirred until a clear solution was observed. To this clear solution, the previously manufactured (In,Ga)$_2$Se$_3$ solution was added. Subsequently, a solution produced by dissolving 1.364 g of CuCl$_2$*2H$_2$O in 50 ml of distilled water was added thereto and then was stirred for six hours. The resulting solution was purified through centrifugation and then vacuum-dried, resulting in particles having a Cu$_{0.81}$In$_{0.74}$Ga$_{0.26}$Se$_{2.5}$ composition. The particles were analyzed using ICP. As a result, it was confirmed that the Cu$_{0.81}$In$_{0.74}$Ga$_{0.26}$Se$_{2.5}$ composition particles have a composition as follows: Cu:In:Ga:Se:Na:B of 17.62:16.18:5.61:56.22:4.16:0.22 in mol %. In addition, as an XRD analysis result, the particles were observed as having a CuSe crystalline phase and as being in a mix state of amorphous (In,Ga)$_2$Se$_3$ and CuSe having superior crystallinity. SEM-EDX and XRD results of the particles are illustrated in FIGS. 10 and 11.

Example 7

Synthesis of In$_2$Se$_3$—CuSe Particles

Under a nitrogen atmosphere, 1.248 g of NaBH$_4$ was added to 50 ml of distilled water and dissolved therein. Subsequently, a solution produced by dissolving 2.128 g of H$_2$SeO$_3$ in 30 ml of distilled water was added thereto. After confirming formation of a colorless and transparent solution, a solution produced by dissolving 2.212 g of InCl$_3$ in 50 ml of distilled water was added thereto and then was further stirred for 1 day, resulting in In$_2$Se$_3$ particle formation. Under a nitrogen atmosphere, after dissolving 0.832 g of NaBH$_4$ in 50 ml of distilled water in another flask and then a solution produced by dissolving 1.419 g of H$_2$SeO$_3$ in 20 ml of distilled water was added thereto. The resulting mixture was stirred until a clear solution was observed. To this clear solution, the previously manufactured In$_2$Se$_3$ solution was added. Subsequently, a solution produced by dissolving 1.705 g of CuCl$_2$*2H$_2$O in 50 ml of distilled water and a solution produced by dissolving 0.111 g of polyvinylpyrrolidone in 20 ml of distilled water were added thereto and then was stirred for five hours. The resulting solution was purified through centrifugation and then vacuum-dried, resulting in particles having a CuInSe$_{2.5}$ composition. The particles were analyzed using ICP. As a result, it was confirmed that the CuInSe$_{2.5}$ composition particles have a composition as follows: Cu:In:Se:Na:B of 19.49:19.97:48.81:3.75:7.98 in mol %. In addition, as an XRD analysis result, the particles were observed as having a CuSe crystalline phase and as being in a mix state of amorphous In$_2$Se$_3$ and CuSe having superior crystallinity. SEM-EDX and XRD results of the particles are illustrated in FIGS. 12 and 13.

Comparative Example 1

8 mmol of CuCl, 10 mmol of InCl$_3$ and 20 mmol of Se powder were added to 100 ml of oleylamine and then were stirred for four hours while heating to 80° C. under vacuum suction. Subsequently, the resulting mixture was reacted for four hours at 240° C. under a nitrogen atmosphere and then was cooled off. The resulting reactant was purified through centrifugation using hexane and ethanol. As a result, nanoparticles having a CuInSe$_2$ composition were obtained. SEM-EDX and XRD results of the particles are illustrated in FIGS. 14 and 15.

Example 8

Manufacture of Thin Film

Particles having a CuIn$_{0.7}$Ga$_{0.3}$Se$_{2.5}$ composition manufactured according to Example 4 were added to a mix solvent including ethanol, ethylene glycol monomethyl ether, acetylacetone, propylene glycol proyl ether, cyclohexanone, ethanolamine, 1,2-propanediol, diethylene glycol monoethyl ether, glycerol and sodium dodecyl sulfate, and then were dispersed in a concentration of 21% to manufacture an ink. The obtained ink was coated on glass coated with a Mo thin film and then dried up to 200° C. The coated glass was heat-treated at 550° C. under a Se-containing atmosphere, resulting in a CIGS thin film. SEM-EDX and XRD results of the resulting thin film are illustrated in FIGS. 16 and 17.

Example 9

Manufacture of Thin Film

The particles having a CuIn$_{0.7}$Ga$_{0.3}$Se$_{2.5}$ composition manufactured according to Example 4 and CuSe particles were mixed in a ratio of 24% and 1.2%. The resulting mixture was added to a mix solvent including ethylene glycol monomethyl ether, propylene glycol proyl ether, ethanolamine, 1,2-propanediol and diethylene glycol monoethyl ether, and then dispersed to manufacture an ink. The obtained ink was coated on glass coated with a Mo thin film and then dried up to 200° C. The coated glass was heat-treated at 550° C. under a Se-containing atmosphere, resulting in a CIGS thin film. SEM-EDX and XRD results of the resulting thin film are illustrated in FIGS. 18 and 19.

Example 10

Manufacture of Thin Film

The particles having a $Cu_{0.8}In_{0.7}G_{0.3}Se_{2.5}$ composition manufactured according to Example 6 and $Cu_{0.87}Se$ nanoparticles were mixed. The resulting mixture was added to a mix solvent including ethylene glycol monomethyl ether, propylene glycol proyl ether, ethanolamine, 1,2-propanediol and diethylene glycol monoethyl ether, and then dispersed to manufacture an ink. The obtained ink was coated on glass coated with a Mo thin film and then dried up to 200° C. The coated glass was heat-treated at 550° C. under a Se-containing atmosphere, resulting in a CIGS thin film. SEM-EDX and XRD results of the resulting thin film are illustrated in FIGS. 20 and 21.

Example 11

Manufacture of Thin Film

Particles having a $CuInSe_{2.5}$ composition manufactured according to Example 7 were added to a mix solvent including ethanol, ethylene glycol monomethyl ether, acetylacetone, propylene glycol proyl ether and cyclohexanone, and then were dispersed in a concentration of 20% to manufacture an ink. The obtained ink was coated on glass coated with Mo thin film and then dried up to 160° C. The coated glass was pressed with a pressure of 300 bar and then heat-treated at 550° C. under a Se-containing atmosphere, resulting in a CIS thin film. SEM-EDX and XRD results of the resulting thin film are illustrated in FIGS. 22 and 23.

Comparative Example 2

Manufacture of Thin Film

Particles having a $CuInSe_2$ composition manufactured according to Comparative Example 1 were added to a mix solvent including ethanol, ethylene glycol monomethyl ether, acetylacetone, propylene glycol proyl ether, cyclohexanone and then dispersed in a concentration of 20% to manufacture an ink. The obtained ink was coated on glass coated with a Mo thin film and then dried up to 160° C. Subsequently, the coated class was pressed at a pressure of 300 bar and then heat-treated at 550° C. under a Se-containing atmosphere, resulting a CIS thin film. SEM-EDX and XRD results of the resulting thin film are illustrated in FIGS. 24 and 25. As shown in FIG. 24, it was confirmed that the thin film manufactured using the $CuInSe_2$ particles had lots of voids and particle growth was slow.

Example 12

Manufacture of Solar Cell having Thin Film

A CdS buffer layer was manufactured on a CIGS thin film manufactured according to Example 8 using a CBD method. Subsequently, ZnO and Al:ZnO were sequentially deposited on the CIGS thin film by sputtering and then an Al electrode was deposited on the deposited CIGS thin film by e-beam to manufacture a cell. The resulting cell showed characteristics as follows: $J_{sc}$=24.86 mA/sqcm, $V_{oc}$=0.23 V, FF=36.55%, and Eff=2.09%.

Example 13

Manufacture of Solar Cell Having Thin Film

A CdS buffer layer was manufactured on a CIGS thin film manufactured according to Example 9 using a CBD method. Subsequently, ZnO and Al:ZnO were sequentially deposited on the CIGS thin film by sputtering and then an Al electrode was deposited on the deposited CIGS thin film by e-beam to manufacture a cell. The resulting cell showed characteristics as follows: $J_{sc}$=29.33 mA/sqcm, $V_{oc}$=0.42 V, FF=42.0% and Eff=5.20%.

Example 14

Manufacture of Solar Cell Having Thin Film

A CdS buffer layer was manufactured on a CIGS thin film manufactured according to Example 9 using a CBD method. Subsequently, ZnO and Al:ZnO were sequentially deposited on the CIGS thin film by sputtering and then an Ag electrode was deposited on the deposited CIGS thin film by screen-printing to manufacture a cell. The resulting cell showed characteristics as follows: $J_{sc}$=34.07 mA/sqcm, $V_{oc}$=0.30 V, FF=34.28% and Eff=3.48%.

Example 15

Manufacture of Solar Cell Having Thin Film

A CdS buffer layer was manufactured on a CIGS thin film manufactured according to Example 10 using a CBD method. Subsequently, ZnO and Al:ZnO were sequentially deposited on the CIGS thin film by sputtering and then an Al electrode was deposited on the deposited CIGS thin film by e-beam to manufacture a cell. The resulting cell showed characteristics as follows: $J_{sc}$=26.87 mA/sqcm, $V_{oc}$=0.43 V, FF=49.01% and Eff=5.61%. A graph showing current-voltage characteristics of a solar cell using the thin film is illustrated in FIG. 26.

Example 16

Manufacture of Solar Cell Having Thin Film

A CdS buffer layer was manufactured on a CIS thin film manufactured according to Example 11 using a CBD method. Subsequently, ZnO and Al:ZnO were sequentially deposited on the CIS thin film by sputtering and then an Al electrode was deposited on the deposited CIS thin film by e-beam to manufacture a cell. The resulting cell showed characteristics as follows: $J_{sc}$=28.37 mA/sqcm, $V_{oc}$=0.23 V, FF=34.08% and Eff=2.19%.

Comparative Example 3

Manufacture of Solar Cell Having Thin Film

A CdS buffer layer was manufactured on a CIS thin film manufactured according to Comparative Example 2 using a CBD method. Subsequently, ZnO and Al:ZnO were sequentially deposited on the CIS thin film by sputtering and then an Al electrode was deposited on the deposited CIS thin film by e-beam to manufacture a cell. The resulting cell showed characteristics as follows: $J_{sc}$=13.45 mA/sqcm, $V_{oc}$=0.18 V, FF=26.63% and Eff=0.6%.

Experimental Example 1

Compositions of particles manufactured according to Examples 1 to 7 and Comparative Example 1 were analyzed.

Results are summarized in Table 1 below. Photoelectric efficiencies of thin film solar cells, which are based on the above particles, manufactured according to Examples 12 to 16, and Comparative Example 3 were measured. Results are summarized in Table 2 below.

TABLE 1

|  | Cu atomic % | Se or S atomic % | In atomic % | Ga atomic % |
|---|---|---|---|---|
| Example 1 | 23.9 | 52.85 | 23.26 | — |
| Example 2 | 24.86 | 55.21 | 19.94 | — |
| Example 3 | 27.17 | 51.9 | 20.93 | — |
| Example 4 | 25.67 | 51.77 | 13.86 | 8.7 |
| Example 5 | 28.48 | 49.86 | 21.66 | — |
| Example 6 | 22.45 | 57.05 | 13.22 | 7.29 |
| Example 7 | 25.08 | 47.63 | 27.28 | — |
| Comparative Example 1 | 24.83 | 51.82 | 23.35 | — |

TABLE 2

|  | $J_{sc}$ (mA/cm$^2$) | $V_{oc}$ (V) | FF (%) | Photoelectric efficiency (%) |
|---|---|---|---|---|
| Example 12 | 24.86 | 0.23 | 36.55 | 2.09 |
| Example 13 | 29.33 | 0.42 | 42.0 | 5.20 |
| Example 14 | 34.07 | 0.30 | 34.28 | 3.48 |
| Example 15 | 26.87 | 0.43 | 49.01 | 5.61 |
| Example 16 | 28.37 | 0.23 | 34.08 | 2.19 |
| Comparative Example 3 | 13.45 | 0.18 | 26.63 | 0.6 |

In Table 2, $J_{sc}$, which is a variable determining the efficiency of each solar cell, represents current density, $V_{oc}$ denotes an open circuit voltage measured at zero output current, the photoelectric efficiency means a rate of cell output according to irradiance of light incident upon a solar cell plate, and fill factor (FF) represents a value obtained by dividing a value obtained by multiplication of current density and voltage values at a maximum power point by a value obtained by multiplication of Voc by $J_{sc}$.

Referring to Table 2 and FIG. 26, the CI(G)S thin films manufactured using the aggregated precursor according to the present invention showed improvement in the current intensity, open circuit voltage, and photoelectric efficiency, when compared to CI(G)S thin films manufactured by using single-phase particles of the prior CuInS(Se)$_2$. Especially, the current intensity and open circuit voltage of the CI(G)S thin films manufactured using the aggregated precursor according to the present invention were extremely superior.

Those skilled in the art will appreciate that various modifications, additions and substitutions are possible, without departing from the scope and spirit of the invention as disclosed in the accompanying claims.

INDUSTRIAL APPLICABILITY

As described above, when a thin film is manufactured using an aggregated precursor including a first phase including a copper (Cu)-containing chalcogenide and a second phase including an indium (In) and/or gallium (Ga)-containing chalcogenide according to the present invention manufactured in one reactor through a sequential process, the thin film has an entirely uniform composition and is stable against oxidization. In addition, the precursor includes S or Se and thereby the amount of a Group VI element in a final thin film is increased, and, accordingly, a superior quality thin film may be manufactured.

The invention claimed is:

1. A method of manufacturing an aggregated precursor for manufacturing a light absorption layer of solar cells, the method comprising:
    preparing a first solution comprising a reducing agent;
    preparing a second solution comprising a sulfur(S) and/or selenium (Se) compound, a third solution comprising indium (In) salt or indium (In) salt and gallium (Ga) salt and a fourth solution comprising a copper (Cu) salt;
    mixing the first solution and second solution to manufacture a mixture;
    mixing and reacting the third solution with the mixture of the mixing to synthesize indium (In) and/or gallium (Ga)-containing chalcogenide particles; and
    synthesizing the aggregated precursor for manufacturing a light absorption layer by mixing the fourth solution with the solution comprising the indium (In) and/or gallium (Ga)-containing chalcogenide particles of the mixing and reacting to synthesize a first phase comprising a copper (Cu)-containing chalcogenide and a second phase comprising an indium (In) and/or gallium (Ga)-containing chalcogenide, wherein the steps of mixing and synthesizing are performed in a single reactor.

2. The method according to claim 1, wherein, when the fourth solution is mixed with the indium (In) and/or gallium (Ga)-containing chalcogenide particles of the synthesizing, an additive is further added.

3. The method according to claim 1, wherein, before the synthesizing, a fifth solution comprising a reducing agent and a sixth solution comprising a sulfur(S) and/or selenium (Se) compound are mixed to manufacture a mixture and then the mixture is mixed with the solution comprising the indium (In) and/or gallium (Ga)-containing chalcogenide particles of the synthesizing and the fourth solution.

4. The method according to claim 3, wherein, when the mixture of the fifth solution and the sixth solution, the solution comprising indium (In) and/or gallium (Ga)-containing chalcogenide particles and the fourth solution are mixed, an additive is further added.

5. The method according to claim 1, wherein the reducing agent is an organic reducing agent and/or inorganic reducing agent.

6. A method of manufacturing an aggregated precursor for manufacturing a light absorption layer, the method comprising:
    preparing a first solution comprising a sulfur (S) and/or selenium (Se) compound, a second solution comprising an indium (In) salt or indium (In) salt and gallium (Ga) salt, and a third solution comprising a copper (Cu) salt;
    mixing and reacting the first solution and the second solution to synthesize indium (In) and/or gallium (Ga)-containing chalcogenide particles; and
    mixing the third solution with the solution comprising the indium (In) and/or gallium (Ga)-containing chalcogenide particles of the mixing and reacting to synthesize and purify an aggregated precursor for manufacturing a light absorption layer comprising a first phase comprising the copper (Cu)-containing chalcogenide and a second phase comprising the indium (In) and/or gallium (Ga)-containing chalcogenide, wherein the mixing steps are performed in a single reactor.

7. The method according to claim 6, wherein, when the indium (In) and/or gallium (Ga)-containing chalcogenide particles of the mixing are mixed with the third solution, an additive is further added.

8. The method according to claim 6, wherein, when the indium (In) and/or gallium (Ga)-containing chalcogenide particles of the mixing are mixed with the third solution, a fourth solution comprising a sulfur (S) and/or selenium (Se) compound is mixed together.

9. The method according to claim 8, wherein, when the solution comprising the indium (In) and/or gallium (Ga)-containing chalcogenide particles, the third solution and the fourth solution are mixed, an additive is further added.

10. The method according to claim 1, wherein the sulfur (S) compound is at least one selected from the group consisting of sulfur (S) powder, $H_2S$, $Na_2S$, $K_2S$, CaS, $(CH_3)_2S$, $H_2SO_4$ and hydrates thereof, thiourea, and thioacetamide.

11. The method according to claim 1, wherein the selenium (Se) compound is at least one selected from the group consisting of Se powder, $H_2Se$, $Na_2Se$, $K_2Se$, CaSe, $(CH_3)_2Se$, $SeO2$, $SeCl_4$, $H_2SeO_3$, $H_2SeO_4$ and hydrates thereof, selenourea, and selenous acid.

* * * * *